United States Patent [19]

Kianush et al.

[11] Patent Number: 5,715,529
[45] Date of Patent: Feb. 3, 1998

[54] FM RECEIVER INCLUDING A PHASE-QUADRATURE POLYPHASE IF FILTER

[75] Inventors: Kaveh Kianush; Wolter Bijker; Wolfdietrich G. Kasperkovitz; Hendricus C. De Ruyter; Willem A. Sloof, all of Eindhoven, Netherlands

[73] Assignee: U.S. Philips Corporation, New York, N.Y.

[21] Appl. No.: 63,384

[22] Filed: May 18, 1993

[30] Foreign Application Priority Data

Jun. 26, 1992 [EP] European Pat. Off. ............ 92201907

[51] Int. Cl.$^6$ ........................................ H04B 1/26
[52] U.S. Cl. .................. 455/266; 455/307; 455/324; 455/340
[58] Field of Search ........................ 455/296, 303, 455/306, 307, 200.1, 250.1, 251.1, 245.2, 240.1, 241.1, 266, 214, 207–209, 315, 324; 329/321, 323

[56] References Cited

U.S. PATENT DOCUMENTS

| | | | |
|---|---|---|---|
| 1,342,885 | 6/1920 | Armstrong | 455/315 |
| 4,066,972 | 1/1978 | Ishigaki et al. | 329/136 |
| 4,079,330 | 3/1978 | Ishigaki et al. | 455/307 |
| 4,696,055 | 9/1987 | Marshall | 455/126 |
| 4,776,039 | 10/1988 | Akaiwa | 455/209 |
| 4,885,801 | 12/1989 | Hansen | 455/307 |
| 4,903,332 | 2/1990 | Hansen | 455/209 |
| 4,914,408 | 4/1990 | Voorman | 455/306 |
| 5,001,776 | 3/1991 | Clark | 455/226.2 |
| 5,159,709 | 10/1992 | Hansen | 455/340 |
| 5,187,809 | 2/1993 | Rich et al. | 455/324 |
| 5,204,977 | 4/1993 | Feldt | 455/241.1 |
| 5,220,686 | 6/1993 | Kasperkovitz et al. | 455/240.1 |
| 5,341,107 | 8/1994 | Bijker et al. | 455/214 |
| 5,404,589 | 4/1995 | Bijker et al. | 455/200.1 |

Primary Examiner—Nguyen Vo

[57] ABSTRACT

An FM receiver having an RF section, a first tunable mixer stage for the frequency conversion of a desired RF FM reception signal into a first intermediate frequency signal, an IF device and an FM demodulator. In order to enhance the integration of the apparatus, while maintaining a signal processing ability which is free from distortion, the FM receiver includes circuitry incorporated in the signal path for converting a single-phase signal into a pair of signals in mutual phase quadrature. The pair of phase-quadrature signals is applied to in-phase and quadrature signal paths of the IF device. The IF device having a polyphase IF filter incorporated in the in-phase and quadrature signal paths and has a bandpass characteristic which is symmetrical around its resonance frequency. The polyphase IF filter is coupled to the FM demodulator.

12 Claims, 3 Drawing Sheets

5,715,529

FM RECEIVER INCLUDING A PHASE-QUADRATURE POLYPHASE IF FILTER

BACKGROUND OF THE INVENTION

This invention relates to an FM receiver comprising an RF section, a first tunable mixer stage for the frequency conversion of a desired RF FM reception signal into a first intermediate frequency signal, an IF device and an FM demodulator.

FIELD OF THE INVENTION

FM receivers of the above-mentioned type are known per se as superheterodyne FM receivers.

It is known to realize a high intermediate frequency (IF) selectivity so as to avoid disturbances of the signal processing in the known FM receiver as much as possible. However, complex IF filters, which are difficult to integrate and hence costly, are required for this purpose. The use of active integrated and hence low-cost filters is not possible in the known FM receiver concept without making concessions to the IF selectivity and/or the dynamic range.

In fact, the usual requirements regarding the dynamic range in FM receivers imposes a given upper limit on the quality factor Q of the IF filter. To satisfy the conflicting requirements of a sufficiently large dynamic range, on the one hand, and a high selectivity, on the other hand, when using small and hence easily integrable capacitances, there is currently a tendency to realize the IF selectivity at the lowest possible intermediate frequency. However, the further decrease of the resonance frequency of a conventional IF filter is accompanied by a growing asymmetry in the amplitude or response characteristic around the resonance frequency so that there is a strong increase of the second-order distortion in particular.

SUMMARY OF THE INVENTION

It is an object of the invention to enhance the selectivity and the degree of integration of the known FM receiver while maintaining a sufficiently large dynamic range.

To this end an FM receiver according to the invention is characterized by means incorporated in the signal path of the FM receiver for converting a single-phase signal into a pair of signals in mutual phase quadrature, said pair of phase-quadrature signals being applied to in-phase and quadrature signal paths of the IF device. The IF device comprises a polyphase IF filter incorporated in said in-phase and quadrature signal paths and has a bandpass characteristic which is symmetrical around its resonance frequency. The polyphase IF filter is coupled to the FM demodulator.

The invention is based on the recognition that a low-distortion selection of an FM IF signal at a comparatively low intermediate frequency can be realized in a simpler manner with a polyphase filter rather than with a single-phase filter because the bandpass characteristic of a single-phase filter at lower values of the resonance frequency cannot or can only hardly be made symmetrical around this resonance frequency, whereas this is possible in known manner with a polyphase filter. Such polyphase filters are known, for example, from European Patent Applications EP 0 344 852, corresponding to U.S. Pat. No. 4,914,408, and EP 0 420 974, corresponding to U.S. Pat. No. 5,220,686.

The measure according to the invention includes a signal conversion from single phase to phase quadrature so as to make the use of said polyphase filter possible and hence either enhance the selectivity in the case of an equal distortion or reduce the distortion in the case of an equal selectivity, or by enhancing the selectivity and reducing the distortion as compared with the known FM receiver, while maintaining the dynamic range.

A preferred embodiment of the FM receiver according to the invention, in which an accurate signal conversion from single phase to phase quadrature is obtained in a simple manner, is characterized in that the IF device comprises, consecutively coupled to the first mixer stage, a first IF stage, a second mixer stage for a down-conversion of the first IF signal into a second IF signal, and a second IF stage, said second mixer stage being pan of said means for converting a single-phase signal into a pair of signals in mutual phase quadrature and comprising an in-phase and a quadrature mixer circuit having a common signal input for applying the first IF signal thereto and an in-phase and a quadrature output, local in-phase and quadrature oscillator mixing signals being applied from a local oscillator to said in-phase and quadrature mixer circuits, respectively, for convening the first intermediate frequency signal into in-phase and quadrature components of the second IF signal, said polyphase IF filter being arranged between the in-phase and quadrature outputs of the second mixer stage and a pair of phase-quadrature inputs of the FM demodulator.

To realize an integrable high IF selectivity in a simple manner, a further preferred embodiment of the FM receiver according to the invention is characterized in that the polyphase IF filter comprises first and second resonance amplifiers consecutively arranged in cascade in the signal direction.

The use of one or more resonance amplifiers for IF selectivity in an FM receiver is known per se from the last-mentioned European Patent Application EP 0 420 974. However, the measure of using such resonance amplifiers as IF polyphase filters of the phase-quadrature type provides the possibility of choosing the second intermediate frequency to be considerably lower than has hitherto been conventional practice in known FM receivers of the superheterodyne type, while maintaining a symmetrical bandpass characteristic and a point-symmetrical phase characteristic. A further integration of the IF filter is thereby possible, while maintaining a low-distortion IF signal selection.

Such an FM receiver is preferably characterized in that each one of said resonance amplifiers has a tuning control input for controlling the tuning, while an output of the cascade arrangement of the first and second resonance amplifiers is coupled via the frequency demodulator to a tuning control signal generating circuit, first and second outputs of which are coupled to the tuning control inputs of the first and second resonance amplifiers, respectively, said tuning control signal generating circuit deriving for each resonance amplifier a tuning control signal from the output signal of the frequency demodulator and thereby constituting first and second tuning control loops from the output to the tuning control input of the first and second resonance amplifiers, respectively, the open loop gain of each one of the first and second tuning control loops being smaller than one.

When this measure is used, the tuning frequency of each one of the first and second resonance amplifiers instantaneously follows the modulation signal of the IF signal. With respect to the situation without tuning control, the bandwidth of these resonance amplifiers may be further narrowed, which enhances the IF selectivity, and a much smaller part of the transfer characteristic of the resonance amplifiers is traversed by the IF signal to be selected which results in a considerable reduction of distortion. Simultaneously, instabilities in the tuning control are obviated.

In a further preferred embodiment of an FM receiver according to the invention, in which due to a neighboring transmitter coming within the capture range of the tuning control loop as a result of an instantaneously occurring large frequency deviation and being dominant in this loop with respect to the desired transmitter, it is prevented that the tuning control captures the desired tuning and is drawn away from this tuning by this unwanted neighboring transmitter, the tuning control signal generating circuit comprises an amplifier-limiter coupled to the output of the frequency demodulator. This amplifier-limiter has a gain factor which is smaller than one and is active for each one of the two first and second tuning control loops. Its gain decreases gradually at an increasing input signal amplitude and supplies an output signal whose amplitude increases monotonically to a limitation value for a continuous and gradual limitation of the tuning control signal in each one of the two first and second tuning control loops at an increasing output signal amplitude of the FM demodulator.

A further preferred embodiment of an FM receiver according to the invention is characterized in that the tuning control signal generating circuit comprises a cascade arrangement of first and second amplifier-limiters, outputs of which are coupled to the tuning control inputs of the first and second resonance amplifiers, respectively, the gain factor of each one of the first and second amplifier-limiters being smaller than one. In this respect the gain characteristic function of the first and second amplifier-limiters corresponds to that of the afore-mentioned amplifier-limiters active for each one of the two first and second tuning control loops and the second amplifier-limiter as well as the last-mentioned amplifier-limiter influence the loop gain of both the first and the second tuning control loop.

Another preferred embodiment of an FM receiver according to the invention is characterized in that the bandwidth of the first tuning control loop is larger than that of the second tuning control loop.

This measure increases the stability in each one of the first and second tuning control loops.

For a further improvement of the tuning control, a preferred embodiment of the last-mentioned FM receiver according to the invention is characterized in that the first and second amplifier circuits in the tuning control signal generating circuit precede first and second loop filters, respectively.

When this measure is used, the bandwidth of each resonance amplifier can be set to a bandwidth which is favorable for a suitable neighboring selection, without any loss of stability.

A preferred embodiment of an FM receiver according to the invention, which can easily be realized in practice, is characterized in that the frequency demodulator comprises a multiplier circuit and a frequency-dependent phase shifter, in which the polyphase IF filter is coupled to a first input of the multiplier circuit and to a second input of the multiplier circuit via the frequency-dependent phase shifter, said frequency-dependent phase shifter comprising a resonance amplifier.

BRIEF DESCRIPTION OF THE DRAWINGS

These and other aspects of the invention will be apparent from and elucidated with reference to the embodiments described hereinafter. Elements corresponding in function have the same reference indications. In the drawings.

DESCRIPTION OF THE PREFERRED EMBODIMENT

Figure 1:
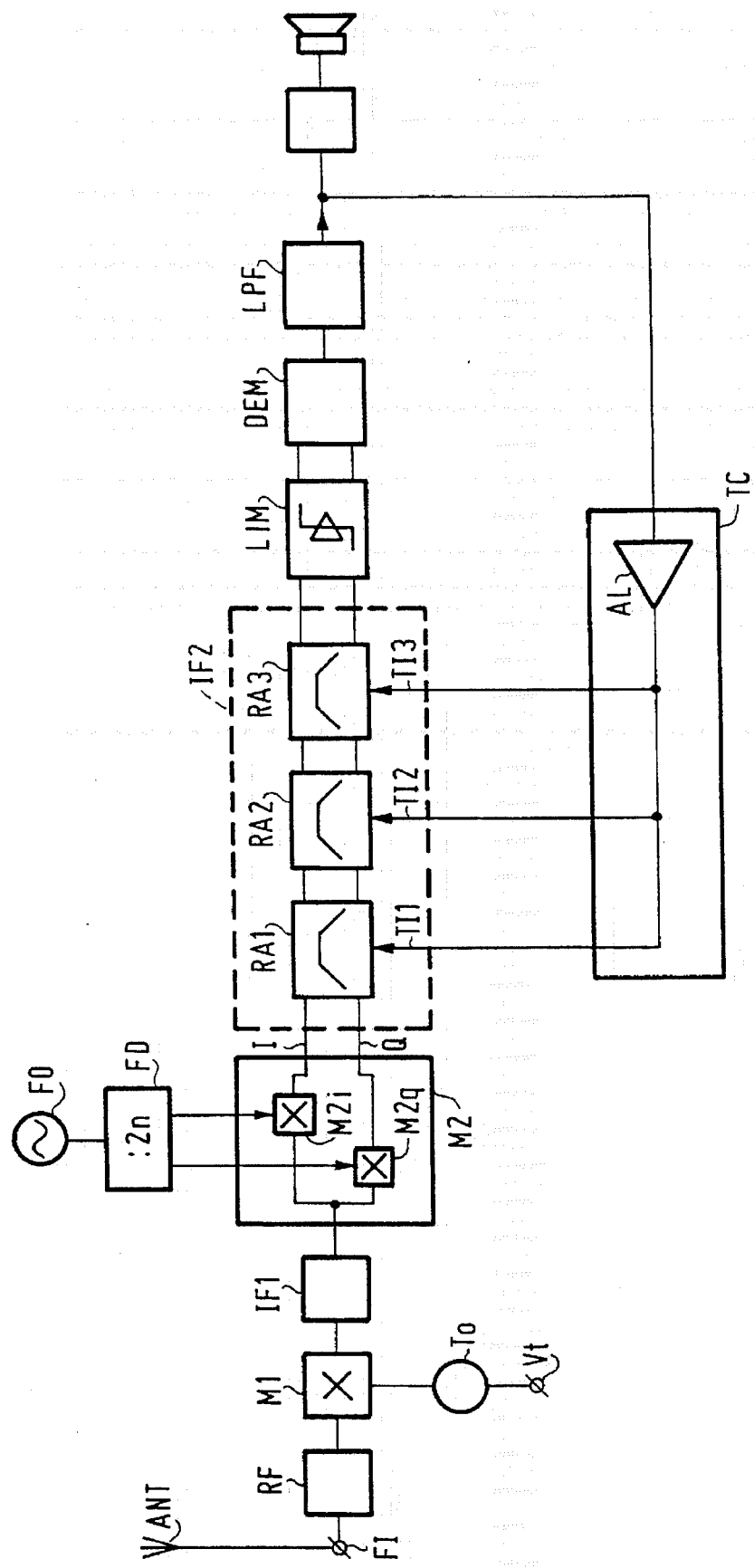
FIG. 1 shows an FM receiver according to the invention.

FIG. 1 shows an FM receiver according to the invention, comprising a radio-frequency (RF) antenna input RFI for connecting an antenna ANT thereto, to which an RF input section RF for RF amplification and selection of a desired RF FM reception signal is coupled. The RF input section is followed by means M1, IF1, M2 for a down-conversion of a desired RF FM reception signal to an intermediate frequency, and comprising a tunable first mixer stage M1 to which a tunable oscillation signal is applied from a tuning oscillator TO for tuning to and frequency conversion of the desired RF FM reception signal to a first intermediate frequency (IF) signal having a carrier frequency located on average at a first intermediate frequency f1, and comprising a first IF section IF1 for selecting the first IF signal, followed by a second mixer stage M2 for a down-conversion of the first IF signal to a second IF signal having on average a carrier frequency located at a second intermediate frequency f2.

The tuning oscillator TO is tuned to a frequency which deviates by the value of f1 from that of the carrier frequency of the desired RF FM reception signal by means of a tuning voltage applied via a tuning control terminal Vt, while a mixing signal having a fixed oscillator frequency deviating by the value of f2 from the first intermediate frequency f1 is applied to the second mixer stage M2 from a fixed local oscillator device FO.

The down-conversion in the second mixer stage M2 is accompanied by a conversion from single phase to phase quadrature. To this end the second mixer stage M2 comprises an in-phase multiplier circuit M2i and a quadrature multiplier circuit M2q to which the first IF signal on the one hand and in-phase and quadrature mixing signal components from the fixed local oscillator device FO, on the other hand, are applied in common. These in-phase and quadrature mixing signal components are obtained by dividing the frequency of the oscillator signal from a fixed oscillator FO by a correct even factor in a frequency divider FD. In a practical embodiment, the first intermediate frequency was 10.7 MHz, the second intermediate frequency was 300 kHz, the oscillator frequency of the FO was 22 MHz and the division factor of the frequency divider FD was 2.

The second mixer stage M2 has in-phase and quadrature outputs which are coupled via in-phase and quadrature signal paths I and Q to a cascade arrangement, functioning as a tunable second IF filter IF2, of first to third tunable resonance amplifiers RA1-RA3 for selecting the second IF signal. Such resonance amplifiers are known per se from European Patent Application EP 0 420 974 and are particularly suitable to be integrated. It is known from the last-mentioned Patent Application that resonance amplifiers in their relevant use as tunable polyphase filters of the phase-quadrature type have a linear tuning behavior, also at very low values of the resonance frequency fres and a bandpass characteristic which is symmetrical around fres and a point-symmetrical phase characteristic, so that a low-distortion selection is obtained. The average value of the resonance frequency fres corresponds to that of the second intermediate frequency f2.

Figure 5:
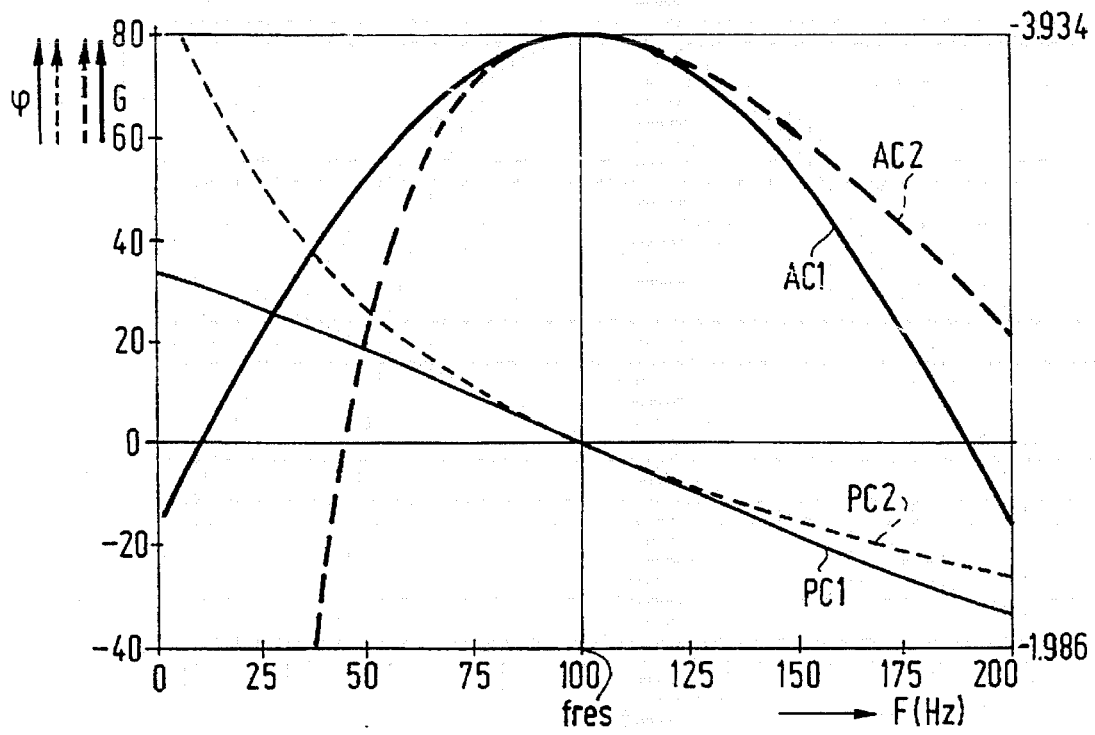
FIG. 5 shows amplitude and phase characteristics of a conventional LC filter and a resonance amplifier.

For the purpose of illustration, FIG. 5 shows, by means of curves AC1 and AC2, the bandpass or amplitude characteristic and, by means of curves PC1 and PC2, the phase transfer characteristic of a resonance amplifier in the relevant use as a phase-quadrature filter and a conventional LC filter, respectively, each around an equal resonance frequency fres. Curves AC1 and AC2 clearly illustrate that a resonance amplifier in the mentioned use has a symmetrical amplitude characteristic and a conventional LC filter has an asymmetrical amplitude characteristic around fres. Curves PC1 and PC2 illustrate that such a resonance amplifier has a point-symmetrical phase characteristic and a conventional LC filter has a more or less quadratic phase characteristic around fres.

The tunable second IF filter IF2 is coupled to a phase-quadrature FM demodulator DEM via a limiter LIM. This limiter LIM eliminates unwanted amplitude variations on the second IF signal. The FM demodulator DEM precedes a low-pass filter LPF for selecting the baseband modulation signal, a baseband modulation signal processing device ASP for processing the baseband signal and the audio modulation signal, and a sound reproducing device L for reproducing the desired audio signal. The phase-quadrature FM demodulator DEM may be of a known type and use, for example, only one of the two in-phase and quadrature components of the second IF signal as an input signal, or it may have a structure known from German Patent Application no. 26 36 268, corresponding to U.S. Pat. No. 4,066,972.

An output of the low-pass filter LPF is also coupled to an amplifier-limiter AL incorporated in a tuning control signal generating circuit TC, an output of said amplifier-limiter being connected in common to tuning control inputs TI1–TI3 of the respective first to third resonance amplifiers RA1–RA3. The amplifier-limiter AL is used for an amplification and a gradual limitation (soft limiting) to be described hereinafter of the IF filter tuning control signal.

First to third IF tuning control loops are obtained via the coupling of the tuning control signal generating circuit TC to each one of the first to third resonance amplifiers RA1–RA3, which tuning control loops instantaneously vary the tuning frequency of each one of the first to third resonance amplifiers RA1–RA3 with the baseband modulation signal of the second IF signal. To obtain a sufficient loop stability, the open loop gain in each one of the first to third IF tuning control loops should be smaller than one. This can be achieved in a simple manner by choosing the gain of the amplifier-limiter AL to have a suitable value which is smaller than one.

Due to the instantaneous control of each one of the first to third resonance amplifiers RA1–RA3, the effective bandwidth of the cascade circuit of RA1–RA3 can be chosen to be considerably smaller than the bandwidth of the baseband modulation signal so that a comparatively high IF selectivity is feasible without any loss of useful signal information.

In view of the symmetrical amplitude characteristic of each one of the first to third resonance amplifiers RA1–RA3, substantially no distortion is introduced.

Figure 2:
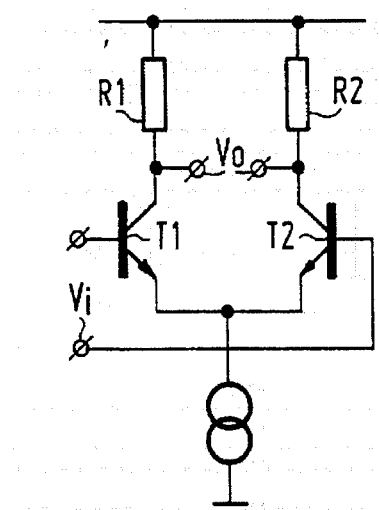
FIG. 2 shows an amplifier-limiter for use in the FM receiver of FIG. 1.
Figure 4:
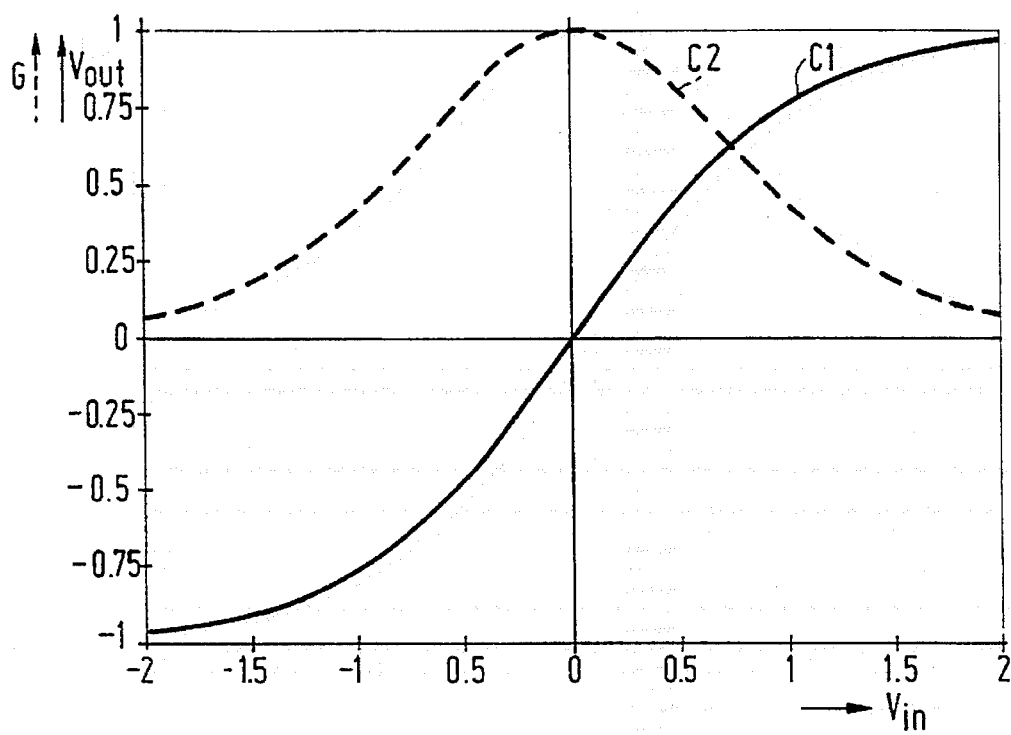
FIG. 4 shows the gain characteristic of an amplifier-limiter for use in the FM receiver of FIG. 1 as a function of the input signal amplitude.

The gain of the amplifier-limiter AL gradually decreases at an increasing input voltage in a manner such that the output voltage increases at an increasing value of the input voltage, for example, in accordance with a tangent hyperbola function and due to saturation phenomena when an input voltage increasing towards infinity asymptotically approximates a given limitation value. The choice of the limitation value will hereinafter be described in greater detail. A transistor difference pair is shown in FIG. 2 and has an emitter coupled transistor pair T1, T2 with a common emitter current source and collector resistors R1 and R2. In the embodiment shown without emitter resistors said tangent hyperbola function is obtained. One may deviate therefrom by using emitter resistors while maintaining the character of a gradual limitation. The amplifier-limiter AL shown supplies an output voltage and a gain which vary as a function of the input voltage, as is shown by means of curves C1 and C2, respectively, in FIG. 4. The realization and the operation of such an amplifier-limiter as well as its behavior for a varying input voltage are known to those skilled in the art and do not require any further description for understanding the invention.

Due to the limitation of the output signal of the amplifier-limiter AL for an output signal of the FM demodulator DEM increasing in amplitude, and when the IF tuning control loop captures an unwanted neighboring transmitter carrier, the IF filter RA1–RA3 will only follow the frequency modulation of this neighboring transmitter carrier in so far and as long as this frequency modulation takes place within the control range of the first to third tuning control loops. If the neighboring transmitter carrier exceeds this control range, the tuning control will be maintained and the IF filter RA1–RA3 will remain at the tuning frequency determined by the limitation level of the IF tuning control signal. When the desired carrier re-appears within the tuning control range of the first to third IF tuning control loops in the last-mentioned position of the IF filter RA1–RA3, the IF filter RA1–RA3 will follow this desired carrier in tuning frequency again and the desired tuning control is thereby restored. Since the amplifier-limiter AL gradually decreases in gain when the amplitude of the demodulator output signal increases, an effective reduction of interference due to capturing phenomena is obtained.

The FM demodulator DEM preferably comprises a resonance amplifier (not shown) as a tunable frequency-dependent phase shifting circuit so that a reliable manufacture of the FM receiver shown is possible in a simple manner by means of matching with the first to third resonance amplifiers RA1–RA3.

The use of circuits having mutually corresponding operations, such as the first tunable resonance amplifier RA1 and the second tunable resonance amplifier RA2, the first amplifier-limiter AL1 and the second amplifier-limiter AL2, the in-phase and quadrature multiplier circuits in the second mixer stage M2 and the multiplier circuit M3, and the common use of circuits in the two tuning control loops provides a considerable matching and hence a simple and accurate manufacture.

Improvements of the tuning control behavior while maintaining the stability are possible by deriving, in the tuning control signal generating circuit TC, an individually adapted tuning control signal from the output signal, selected in the low-pass filter LPF, of the FM demodulator DEM for each one of the first, second and third tuning control loops. The loop gain, loop bandwidth and/or stability may then be optimized for each tuning control loop.

Generally, the open loop gain in each tuning control loop should be smaller than one for the purpose of a satisfactory loop stability, while the phase shift in the tuning control loops should be such that a frequency tracking of the resonance amplifiers is obtained at which the tuning of the resonance amplifiers follows the frequency modulation of the second IF signal substantially instantaneously in frequency.

Figure 3A:
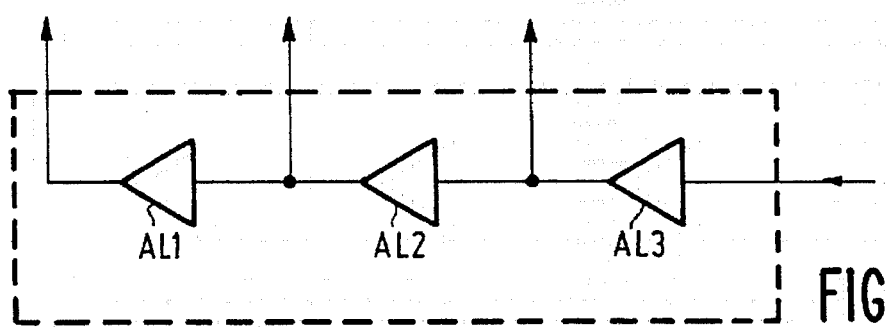
FIGS. 3A-3C show three embodiments of a tuning control signal generating circuit for use in the FM receiver of FIG. 1.

FIG. 3A shows a first preferred embodiment of the tuning control signal generating circuit TC comprising a cascade arrangement of first to third amplifier-limiters AL1–AL3, outputs of which are connected to the tuning control inputs TI1, TI2 and TI3. The open loop gain in each one of the first, second and third tuning control loops is smaller than one and that of the first tuning control loop is smaller than that of the second tuning control loop, while that of the second tuning control loop is smaller than that of the third tuning control loop. The gain factor of each one of the first to third amplifier-limiters AL1–AL3 should then preferably be smaller than one.

Figure 3B:
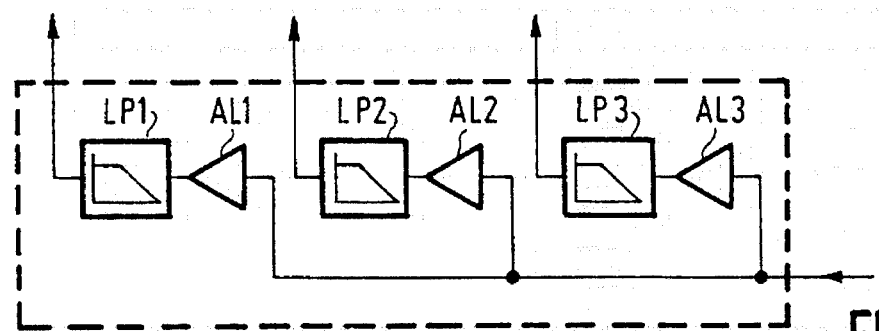

FIG. 3B shows a second preferred embodiment of the tuning control signal generating circuit TC which comprises first, second and third cascade arrangements of the first, second and third amplifier-limiters AL1, AL2 and AL3 with first, second and third low-pass filters LP1, LP2 and LP3 used as first, second and third loop filters. These arrangements are used for deriving individual tuning control signals for the first, second and third tuning control loops. Inputs of the first amplifier-limiter AL1, the second amplifier-limiter AL2 and the third amplifier-limiter AL3 are connected in common to the output of the LPF, while outputs of the first loop filter LP1, the second loop filter LP2 and the third loop filter LP3 are connected to the tuning control inputs TI1, TI2 and TI3, respectively. The gain of the first amplifier-limiter AL1 is preferably smaller than that of the second amplifier-limiter AL2 and the gain of the second amplifier-limiter AL2 is smaller than that of the third amplifier-limiter AL3, while the bandwidths of the first to third loop filters LP1–LP3 are mutually of the same order of magnitude.

Figure 3C:
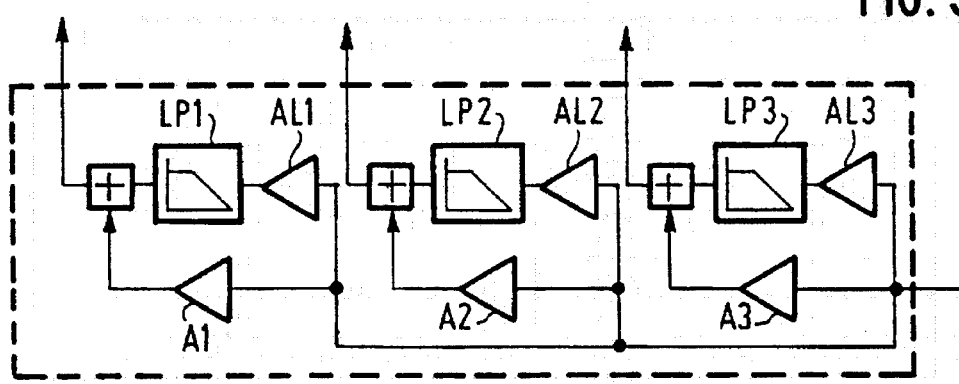

FIG. 3C shows a third preferred embodiment of the tuning control signal generating circuit TC in which the first, the second and the third cascade arrangements of the first amplifier-limiter AL1 with the first loop filter LP1, the second amplifier-limiter AL2 with the second loop filter LP2 and the third amplifier-limiter AL3 with the third loop filter LP3 are dimensioned in a corresponding manner as in the embodiment of FIG. 3B and which are shunted by means of respective amplifier stages A1, A2 and A3. The gain factor of A3 should then be preferably smaller than that of A2 and the gain factor of A2 should be smaller than that of A1. A shunt path for the higher frequencies of the tuning control signals is formed by the amplifier stages A1, A2 and A3.

It will be evident that the invention is not limited to the embodiments shown. For example, it is possible to realize a phase split by means of a resonance amplifier, preceded by a single-phase tunable mixer stage, to use a conventional FM quadrature demodulator instead of the FM demodulator shown, as is known, for example from the previously cited German Patent Application 26 36 268, to form the first and second amplifier-limiters AL1 and AL2 in a different manner (for example, asymmetrically), to omit the second mixer stage M2 and to tune the tunable second IF filter RA1–RA3 and the FM demodulator DEM to the first intermediate frequency f1, to form the tunable second IF filter RA1–RA3 with a different number than the three cascade-arranged resonance amplifiers shown, or with only a single resonance amplifier, to arrange in the FM receiver of FIG. 1 a low-pass filter (not shown) functioning as a loop filter between the output of the first amplifier-limiter AL1 and the common junction point of the connections to the tuning control inputs of the first to third resonance amplifiers RA1–RA3, or to use a single-phase mixer stage instead of the phase-quadrature mixer stage M2 shown, followed by a resonance amplifier as a phase splitter, as is known per se from the afore-mentioned European Patent Application no. 0 420 974. It is also feasible to use the afore-described tuning control in a conventional single-phase tunable IF circuit.

We claim:

1. An FM receiver comprising: a signal path including, in cascade, an RF section, a first tunable mixer stage for a frequency conversion of a desired RF FM reception signal into a first intermediate frequency signal, an IF device and an FM demodulator, and means included in the signal path of the FM receiver for converting a single-phase signal in the signal path into a pair of signals in mutual phase quadrature, said pair of phase-quadrature signals being applied to in-phase and quadrature signal paths of the IF device, said IF device comprising a polyphase IF filter including first and second resonance amplifiers connected in cascade and incorporated in said in-phase and quadrature signal paths and having a resonance frequency and with a bandpass characteristic which is symmetrical around said resonance frequency, said polyphase IF filter being coupled to the FM demodulator, wherein each of said resonance amplifiers provides IF selectivity and each has a tuning control input for controlling the tuning thereof, an output of the cascade arrangement of the first and second resonance amplifiers being coupled via the frequency demodulator to a tuning control signal generating circuit, first and second outputs of said tuning control signal generating circuit being coupled to the tuning control inputs of the first and second resonance amplifiers, respectively, said tuning control signal generating circuit deriving for each resonance amplifier a tuning control signal from the output signal of the FM demodulator and thereby constituting first and second tuning control loops from the output to the tuning control input of the first and second resonance amplifiers, respectively, the open loop gain of each of the first and second tuning control loops being smaller than one and the bandwidth of the first tuning control loop being greater than that of the second tuning control loop.

2. An FM receiver as claimed in claim 1, wherein the IF device comprises, consecutively coupled to the first mixer stage, a first IF stage, a second mixer stage for a down-conversion of the first IF signal into a second IF signal, and a second IF stage, said second mixer stage being part of said means for converting the single-phase signal into the pair of signals in mutual phase quadrature and comprising an in-phase and a quadrature mixer circuit having a common signal input for applying the first IF signal thereto and an in-phase and a quadrature output, a local oscillator supplying local in-phase and quadrature oscillator mixing signals to said in-phase and quadrature mixer circuits, respectively, for converting the first intermediate frequency signal into in-phase and quadrature components of the second IF signal, said polyphase IF filter being coupled between the in-phase and quadrature outputs of the second mixer stage and a pair of phase-quadrature inputs of the FM demodulator.

3. An FM receiver as claimed in claim 2, wherein the polyphase IF filter comprises first and second resonance amplifiers operating as IF polyphase filters of the phase-quadrature type and connected in cascade.

4. An FM receiver as claimed in claim 3, wherein the tuning control signal generating circuit comprises an amplifier-limiter coupled to the output of the frequency demodulator and having a gain factor which is smaller than one, which amplifier-limiter is active for each of the first and second tuning control loops and whose gain decreases gradually for an increasing input signal amplitude and supplies an output signal whose amplitude increase monotonically to a limit value for a continuous and gradual limitation of the tuning control signal in each of the first and second tuning control loops for an increasing output signal amplitude of the FM demodulator.

5. An FM receiver as claimed in claim 3, wherein the tuning control signal generating circuit comprises a cascade arrangement of first and second amplifier-limiters, outputs of which are coupled to the tuning control inputs of the first and second resonance amplifiers, respectively, the gain factor of each of the first and second amplifier-limiters being smaller than one.

6. An FM receiver as claimed in claim 5, wherein the first and second amplifier circuits in the tuning control signal generating circuit precede first and second loop filters, respectively.

7. An FM receiver as claimed in claim 3, wherein each of the first and second resonance amplifiers has a bandwidth control input for setting the bandwidth, the bandwidth of the first tuning control loop being larger than that of the second tuning control loop.

8. An FM receiver as claimed in claim 1, wherein the tuning control signal generating circuit comprises an amplifier-limiter coupled to the output of the frequency demodulator and having a gain factor which is smaller than one, which amplifier-limiter is active for each of the first and second tuning control loops and whose gain decreases gradually at an increasing input signal amplitude and supplies an output signal whose amplitude increases monotonically to a limit value to provide a continuous and gradual limitation of the tuning control signal in each of the first and second tuning control loops for an increasing output signal amplitude of the FM demodulator.

9. An FM receiver as claimed in claim 1, wherein each of the first and second resonance amplifiers has a bandwidth control input for setting the bandwidth, the bandwidth of the first tuning control loop being larger than that of the second tuning control loop.

10. An FM receiver as claimed in claim 1 wherein the signal path comprises, in cascade with the first tunable mixer stage, a first IF stage, and said signal converting means comprises a second mixer stage in cascade with the first IF stage for converting the first IF signal into said pair of phase-quadrature signals forming in-phase and quadrature components of a second IF signal of lower frequency than the first IF signal, and wherein said polyphase IF filter is coupled between in-phase and quadrature outputs of the second mixer stage and a pair of phase-quadrature inputs of the FM demodulator.

11. An FM receiver comprising: a signal path including, in cascade, an RF section, a first tunable mixer stage for a frequency conversion of a desired RF FM reception signal into a first intermediate frequency signal, an IF device and an FM demodulator, and means included in the signal path of the FM receiver for converting a single-phase signal in the signal path into a pair of signals in mutual phase quadrature, said pair of phase-quadrature signals being applied to in-phase and quadrature signal paths of the IF device, said IF device comprising a polyphase IF filter including first and second resonance amplifiers consecutively connected in cascade and incorporated in said in-phase and quadrature signal paths and having a resonance frequency and with a bandpass characteristic which is symmetrical around said resonance frequency, said polyphase IF filter being coupled to the FM demodulator, wherein each of said resonance amplifiers provides IF selectivity and each has a tuning control input for controlling the tuning thereof, an output of the cascade arrangement of the first and second resonance amplifiers being coupled via the frequency demodulator to a tuning control signal generating circuit, first and second outputs of said tuning control signal generating circuit being coupled to the tuning control inputs of the first and second resonance amplifiers, respectively, said tuning control signal generating circuit deriving for each resonance amplifier a tuning control signal from the output signal of the FM demodulator and thereby constituting first and second tuning control loops from the output to the tuning control input of the first and second resonance amplifiers, respectively, the open loop gain of each of the first and second tuning control loops being smaller than one, wherein the tuning control signal generating circuit comprises a cascade arrangement of first and second amplifier-limiters, outputs of which are coupled to the tuning control inputs of the first and second resonance amplifiers, respectively, the gain factor of each of the first and second amplifier-limiters being smaller than one.

12. An FM receiver as claimed in claim 11, wherein the first and second amplifier limiters in the tuning control signal generating circuit precede first and second loop filters, respectively.

* * * * *